(12) United States Patent
Kubo et al.

(10) Patent No.: US 6,818,492 B2
(45) Date of Patent: Nov. 16, 2004

(54) SEMICONDUCTOR DEVICE AND MANUFACTURING METHOD THEREOF

(75) Inventors: Hirotoshi Kubo, Oizumi-machi (JP); Shigeyuki Murai, Oizumi-machi (JP); Hisaaki Tominaga, Oizumi-machi (JP); Hidetaka Sawame, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 53 days.

(21) Appl. No.: 10/016,142

(22) Filed: Dec. 17, 2001

(65) Prior Publication Data

US 2002/0127814 A1 Sep. 12, 2002

(30) Foreign Application Priority Data

Dec. 27, 2000 (JP) ........................................ 2000-397716

(51) Int. Cl.⁷ .................... H01L 21/8238; H01L 21/331
(52) U.S. Cl. ...................................... 438/202; 438/366
(58) Field of Search ................................. 438/202, 366

(56) References Cited

U.S. PATENT DOCUMENTS

| | | | |
|---|---|---|---|
| 4,492,008 A | 1/1985 | Anantha et al. | |
| 4,731,341 A | 3/1988 | Kawakatsu | |
| 4,997,775 A | 3/1991 | Cook et al. | |
| 5,340,753 A | 8/1994 | Bassous et al. | |
| 5,541,124 A | 7/1996 | Miwa et al. | |
| 5,604,374 A | 2/1997 | Inou et al. | |
| 5,789,285 A | * 8/1998 | Yoshihara | ........... 438/202 |
| 5,798,561 A | 8/1998 | Sato | |
| 5,811,871 A | * 9/1998 | Nakashima | ........... 257/565 |
| 6,239,477 B1 | 5/2001 | Johnson | |

FOREIGN PATENT DOCUMENTS

| | | |
|---|---|---|
| JP | 11-154683 | 6/1999 |
| JP | 2000-091565 | 3/2000 |
| JP | 2000-252290 | 9/2000 |

* cited by examiner

*Primary Examiner*—Alexander Ghyka
(74) *Attorney, Agent, or Firm*—Morrison & Foerster LLP (57) ABSTRACT

This invention provides a semiconductor device which is excellent in high-frequency characteristics, wherein emitter diffusion is performed by a trench formed in a base region, the base resistance is further reduced, and the base-emitter capacitance is also reduced. A base electrode layer makes a contact with the whole surface of the base region. A tapered trench is provided in the base region. A finer emitter region is formed by emitter diffusion from the bottom portion of the trench. Since the base electrode is formed adjacently to the trench, the distance between an active region of the base and the base electrode layer can be shortened and a larger grounded area of a base can also be obtained, therefore the base resistance can be substantially reduced. In addition, by forming a fine region, the base-emitter capacitance between the base and emitter can also be reduced, therefore a transistor excellent in high-frequency characteristics can be obtained.

9 Claims, 10 Drawing Sheets

PRIOR ART

FIG.18

PRIOR ART

SEMICONDUCTOR DEVICE AND MANUFACTURING METHOD THEREOF

BACKGROUND OF THE INVENTION

1. Field of the Invention

This invention relates to a semiconductor device and a manufacturing method thereof, and more particularly to a transistor device with improved high-frequency characteristics and a manufacturing method thereof.

2. Description of the Related Art

Figure 17:
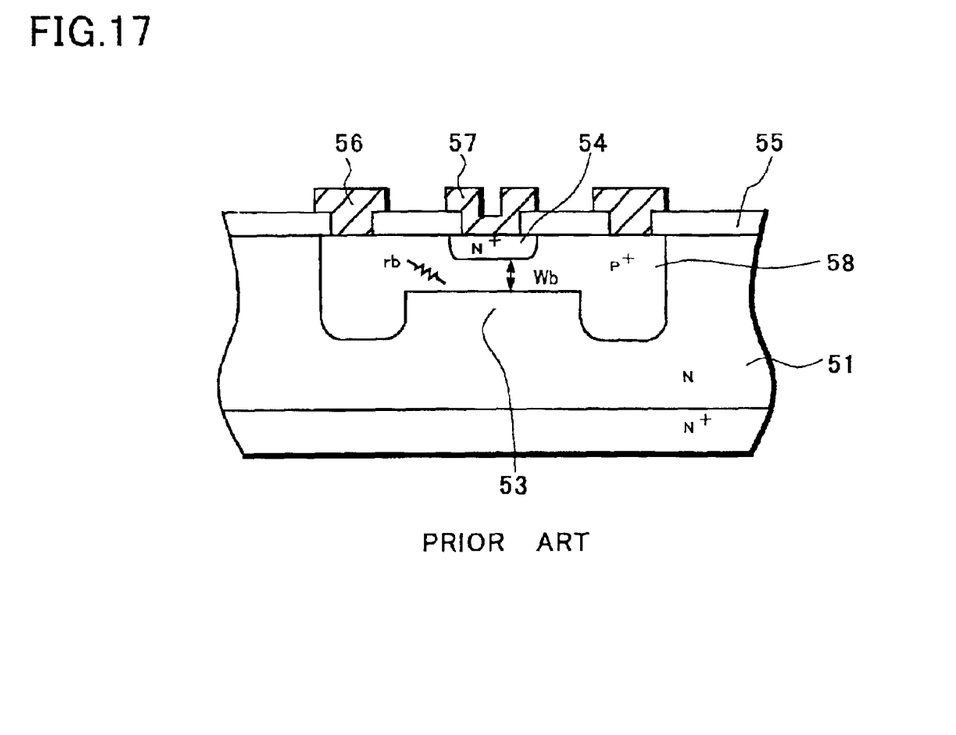
FIG. 17 is a sectional-view of a prior art device.

A structure of a general NPN-type planar transistor is shown in FIG. 17. Namely, on the surface of an N-type collector layer 51 comprising an N⁺-type semiconductor layer, a P-type base region 53 is formed, an N⁺-type emitter region 54 is formed on the surface of the base region 53, and the surface is coated with a silicon oxide film 55. Opening portions are formed on the silicon oxide film 55 so as to become contact holes and a base electrode 56 and an emitter electrode 57 are formed. Since high-frequency characteristics mainly depend on the base width $W_b$, a graft base-type structure where a P⁺-type external base region 58 is provided on the periphery of the emitter region 54 is employed. With this shape, a narrow base width $W_b$ is obtainable and, at the same time, curvature of a depletion layer extending over base-collector junctions is decreased, and base resistance $r_b$ can be reduced.

In addition, in order to obtain a shallow base width $W_b$, a shallow emitter junction is indispensable, therefore, formation of the emitter region 54 by impurity diffusion from a polysilicon layer with impurities doped has been carried out (for example, Japanese Laid-Open Patent Application No. Hei 7-142497).

However, the graft base type has problems such that, since the base region 53 and the external base region 58 are formed by different processes, the processes become complicated and since the shallow base region 53 is formed by thermal diffusion, the diffusion depth thereof easily becomes uneven and unevenness in the high-frequency characteristics also increases.

Figure 18:
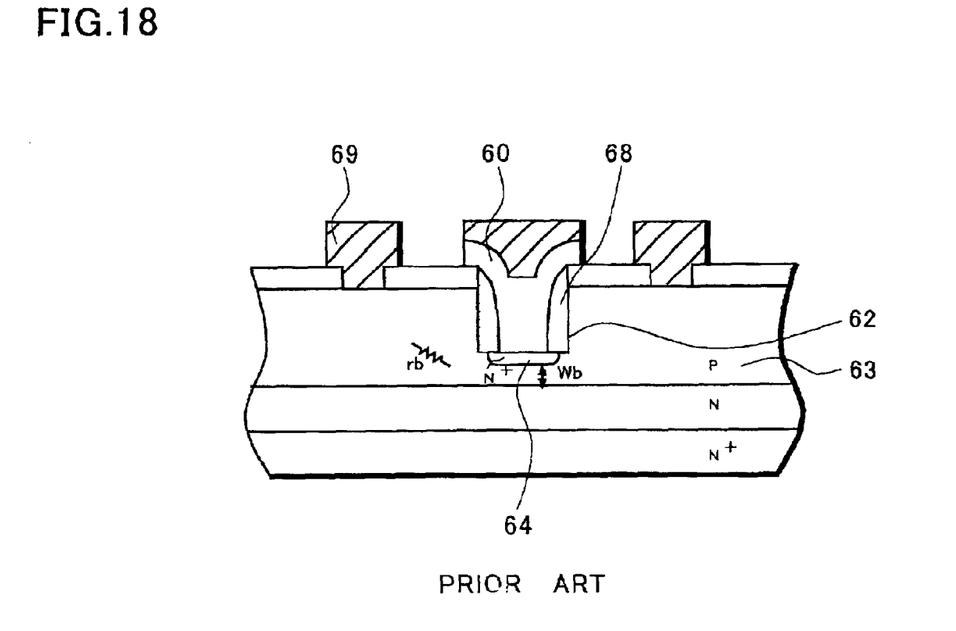
FIG. 18 is a sectional view of another prior art device.

In order to solve such problems, as shown in FIG. 18, a method has been also carried out wherein a sidewall 68 is provided on the inside wall of a trench 62 formed on the base region 63, a diffusion source layer 60 for forming an emitter region is formed on the trench 62, and impurities are diffused from the base region 63 which is exposed at the bottom portion of the trench 62 so that an emitter region 64 is formed (for example, Japanese Laid-Open Patent Application No. 2000-252290).

In a transistor shown in FIG. 18, since the emitter region 64 is formed on the bottom portion of the trench 62, therefore, the base width $W_b$ can be controlled by the length of trench 62. In order to obtain an extremely shallow junction by thermal diffusion, it is necessary to lower the impurity concentration, therefore unevenness occurs, whereas the impurity concentration of the base region 63 can be higher owing to the trench 62 to some extent, whereby unevenness in the base width $W_b$ can be reduced. In addition, since formation of an external base region is unnecessary, the processes also become simple.

However, a base electrode 69 is grounded only via a contact hole, the distance between the base electrode 69 and an active region of the base immediately under the emitter region 64 where carriers move is long and the grounded area is also small, therefore there has been a limit to any further reduction in base resistance $r_b$.

Furthermore, the capacitance $C_{BE}$ is related to the area of the emitter region 64, and $r_b$ and $C_{BE}$ greatly affect $f_T$, which is a cut-off frequency, therefore, reductions in these have been demanded.

SUMMARY OF THE INVENTION

This invention provides a semiconductor device comprising a first conducting type base region formed on the surface of a second conducting type collector layer, a trench provided on the surface of the base region, a second conducting type emitter region formed on the surface of the base region which is exposed at the bottom portion of the trench, a sidewall provided on the inside wall of the trench, and an electrode in contact with the whole surface of the base region excluding the trench. In this configuration, a base electrode layer is provided from the side surface of the trench to the whole surface of the base region, therefore the distance between the active region of the base immediately under the emitter region and the base electrode can be reduced and also the grounded area of the base electrode increases. Namely, the base resistance $r_b$ can be drastically reduced.

Moreover, due to the sidewall provided for the trench, the bottom portion of the trench becomes narrower than the opening portion thereof, therefore the area of the emitter region formed on the bottom portion is reduced, thus realizing a reduction in the capacitance content $C_{BE}$.

Also, a method for manufacturing a semiconductor device of this invention comprises steps of forming a first conducting type base region on the surface of a second conducting type collector layer, forming a base electrode layer on the surface of the base region and forming an insulating film on the surface of this base electrode layer, forming a trench, which does not reach the collector layer, on the base region by creating an opening at a part of the base electrode layer and the insulating film and forming a sidewall on the inside wall of the trench, forming a polysilicon layer containing impurities for emitter diffusion inside the trench, forming an emitter region by diffusing the impurities from the polysilicon layer, and forming a through hole on the insulating film so as to form a base electrode which comes into contact with the base electrode layer and, at the same time, forming an emitter electrode which comes into contact with the polysilicon layer. According to this method, by providing the sidewall for the trench and performing emitter diffusion, the emitter region which is finer than the limit of a photo-etching technique can be formed, thus a transistor device which is superior in the high-frequency characteristics can be manufactured.

Moreover, a method for manufacturing a semiconductor device of this invention comprises steps of preparing a first conducting type collector layer, forming a base electrode layer made of polysilicon containing second conducting type impurities on the surface of the collector layer and forming an insulating film on the surface of this base electrode layer, forming a trench on the collector layer by creating an opening at a part of the base electrode layer and the insulating film and doping second conducting type impurities into the whole surface, forming a sidewall on the inside wall of the trench, forming a polysilicon layer containing impurities for emitter diffusion inside the trench, diffusing the impurities in the periphery of the trench and underneath the base electrode layer for forming a base region and, at the same time, diffusing the impurities from the polysilicon layer for forming an emitter region, forming a through hole on the insulating film and forming a base electrode which comes into contact with the base electrode layer and, at the same time, forming an emitter electrode which comes into contact with the polysilicon layer. According to this methods, the active region of the base immediately under the emitter is formed by diffusing the impurities doped in the periphery of the trench, thus a transistor device which has less unevenness in spite of a shallow junction can be manufactured.

This invention provides a semiconductor structure by which, first, the base resistance $r_b$ can be substantially reduced. The trench is formed using the base electrode layer and the oxide film which are provided on the whole surface as a mask, whereby the trench and the base electrode layer become adjacent to each other. Since carriers move between the active region of the base immediately under the emitter and the base electrode layer, in comparison to the prior art where grounding is carried out only at a contact hole, not only can the distance be substantially shortened but also the grounded area is greatly increased. That is, since the base resistance $r_b$ can be reduced, this becomes greatly advantageous in an improvement in the high-frequency characteristics.

Secondly, the emitter region finer than the limit of the photo-etching technique can be formed. Due to the sidewall on the inside wall of the trench, the bottom portion of the trench becomes narrower than the opening portion thereof in width and the emitter region formed by diffusion of impurities from the bottom portion becomes fine.

In particular, the trench itself for forming the emitter region is formed into a γ-shape where the width of the bottom portion is narrower than that of the opening portion, whereby the area of the emitter region becomes further finer. The area of the emitter region relates to the base-emitter capacitance $C_{BE}$, and this capacitance can be reduced, therefore high-frequency characteristics are greatly improved.

In addition, according to the manufacturing method of this invention, first, only by using the doped polysilicon and insulating film as the mask for creating the openings of the trench for forming the emitter region, the base resistance $r_b$ can be greatly reduced.

Secondly, due to the sidewall provided on the trench, the emitter region which is finer than the limit of the photo-etching technique can be formed. In particular, by changing the etching gases, there is an advantage such that a γ-shaped trench can be formed and a further finer emitter region can be formed.

Thirdly, due to the formation of the trench, the base width $W_b$ can be controlled by the depth of the trench, or the base region can be formed by the diffusion from the trench, therefore in spite of a shallow junction, in either case, the base region and the base active region immediately under the emitter region can be uniformly formed in terms of the impurity concentration and unevenness can be reduced.

That is, it is possible to suppress the unevenness of impurity concentration in the base active region, reduce the base-emitter capacitance, and reduce the base resistance $r_b$. Therefore a semiconductor device which is excellent in high-frequency characteristics and a manufacturing method thereof can be provided.

DETAILED DESCRIPTION OF THE INVENTION

Embodiments of this invention will be described in detail with reference to FIG. 1 through FIG. 16.

Figure 1:
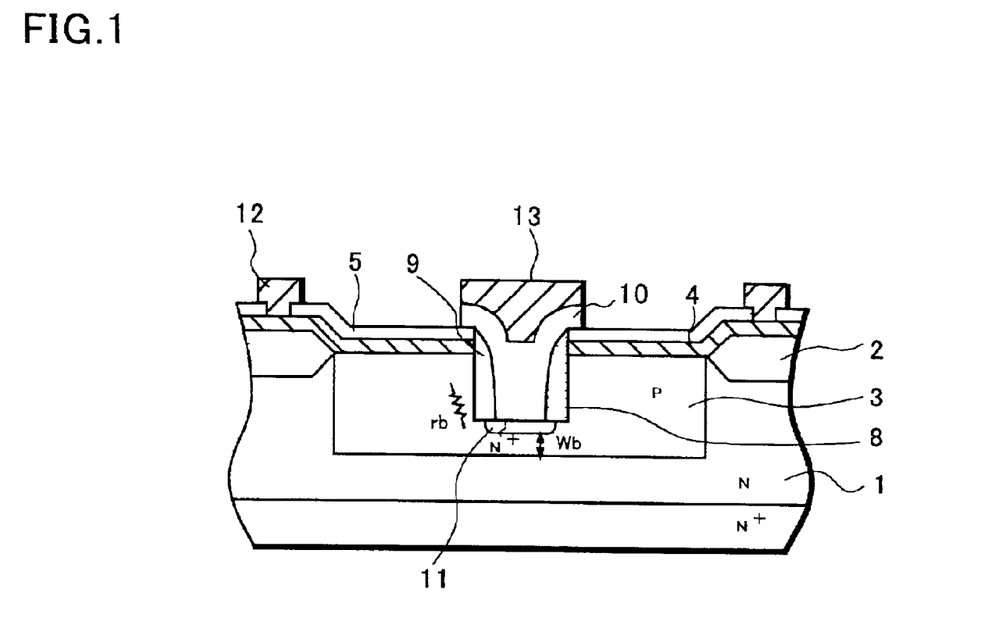
FIG. 1 is a cross-sectional view of a semiconductor device of this invention.

FIG. 1 is a sectional-view of an NPN-type transistor device, which is a first embodiment of this invention.

A transistor comprises a collector layer 1, a base region 3, a base electrode layer 4, a trench 8, a sidewall 9, a polysilicon layer 10, an emitter region 11, a base electrode 12, and an emitter electrode 13.

The collector layer 1 is a semiconductor substrate having an $N^+$-type semiconductor layer on its back face.

The base region 3 is a P-type region formed on the surface of the collector layer 1. This base region 3 is composed of a diffusion region which is formed to have an appointed diffusion depth by thermal diffusion or a semiconductor layer which is formed on the collector layer 1 by vapor-phase growth and has a profile of the impurity concentration fixed in the thickness direction, and has a thickness in the order of 1.0 μm.

The base electrode layer 4 is made of a polysilicon layer which comes into contact with the whole surface of the base region 3 excluding the trench 8 and covers the top of the collector region 1, and includes, for providing conductivity, impurities in the order of $1 \times 10^{14} cm^{-2}$. In addition, in place of the polysilicon layer, a silicide layer or a multi-layer film composed of polysilicon and silicide may be used. Since the base electrode layer 4 covers a part of the collector layer 1 and is provided via a LOCOS oxide film 2 in the order of 12000 Å, the base-collector capacitance can also be reduced. An oxide film 5 is provided on the base electrode layer 4, however, in place of the oxide film 5, an insulating film such as a multi-layer film composed of an oxide film and a nitride film or the like may be provided.

The trench 8 is formed on the surface of the base region 3, is shallower than the base region 3, and has sidewall 9 on its inside wall. The trench 8 has an opening width in the order of 0.5 μm and is dug down to a depth of approximately 0.7 μm from the base region 3 surface, and the emitter region 11 is diffused on the bottom portion of the trench 8.

The sidewall 9 is made of an insulating film such as a non-doped silicon oxide film or the like and coats the inside wall of the trench 8 at a film thickness of approximately 0.1 μm. Accordingly, if the trench 8 is opened with 0.5 μm×0.5 μm, the base region 3 is, due to the sidewall 9, exposed with a size of 0.3 μm×0.3 μm at the bottom portion of the trench 8.

The polysilicon layer 10 covers the inside wall of the trench 8 and becomes a diffusion source of the emitter region 11. In addition, this polysilicon layer 10 constitutes a part of the emitter electrode 13 to be formed on the upper portion thereof.

The emitter region 11 is an N-type impurity diffusion region formed on the surface of the base region 3 which is exposed at the bottom portion of the trench 8, and has a depth in the order of 0.1 μm.

The base electrode 12 is made to contact with the base electrode layer 4 by providing the oxide film 5 on the base electrode layer 4 with a through hole. For the base electrode 12, a conductive material or metal that is similar to that of the base electrode layer 4 is used.

The emitter electrode 13 comes into contact with the polysilicon layer 10 and is provided on the upper portion of the polysilicon layer 10.

Figure 2:
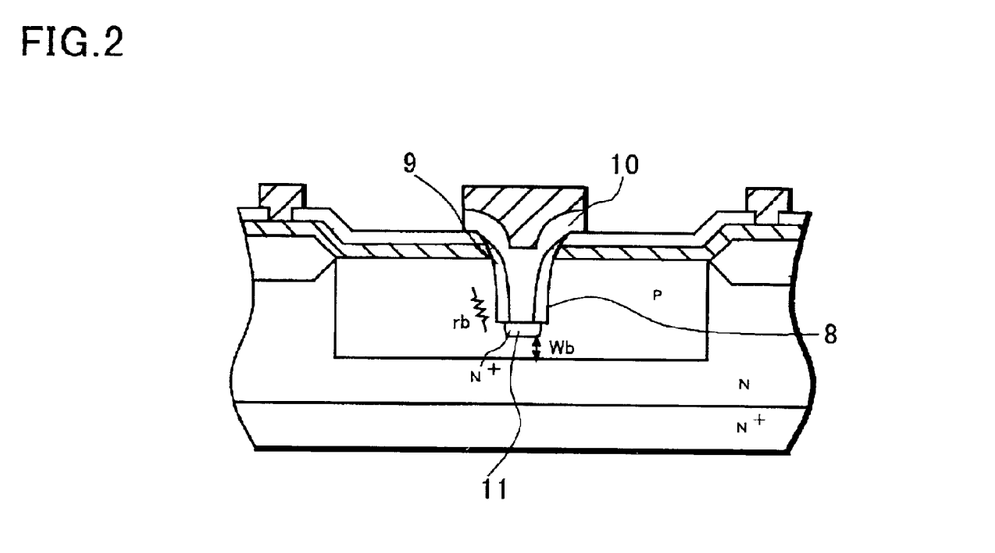
FIG. 2 is a cross-sectional view of another semiconductor device of this invention.

FIG. 2 is a second embodiment of this invention, wherein the trench 8 is formed in a fluted or γ-shape. The trench 8 itself is in a shape having a narrow bottom portion and other components are the same as those of the first embodiment.

When etching gas for forming the trench 8 is changed and anisotropic etching is carried out, the inside wall thereof has an slope, an angle that is created by an tangent line of the slope and the semiconductor substrate surface becomes gradually smaller as it proceeds from the bottom portion of the trench 8 to the semiconductor substrate surface and consequently, a γ-shaped trench 8 whose bottom portion is narrower than the opening portion can be obtained. When a sidewall is formed in this trench 8, an emitter region 11 finer than the emitter region shown in the first embodiment can be formed.

This invention includes by the base electrode layer 4 and the sidewall 9 that is provided on the inside wall of the trench 8.

The base electrode layer 4 is in contact with the whole surface of the base region 3 excluding the trench 8 and by making the base electrode 12 contact therewith via the through hole provided on the oxide film 5, the grounded area of the base electrode 12 can be substantially improved. In addition, in the conventional configuration, the distance between the base electrode and the active region of the base immediately under the emitter region is long and a reduction in the base resistance $r_b$ is difficult, however, in this invention, the distance can be shortened by providing the base electrode layer 4 which extends from the side surface of the trench 8 to the whole surface of the base region 3. Due to the improvement in the grounded area of the base electrode and the reduction in the distance from the base electrode to the region immediately under the emitter region, the base resistance $r_b$ can be substantially reduced, therefore the high-frequency characteristics are greatly improved.

In addition, the trench 8 for emitter diffusion is provided by photo-etching and an opening width in the order of 0.5 μm is the limit of the current technique. However, by providing the sidewall 9, the opening width of the bottom portion of the trench 8 to be used for emitter diffusion, that is the opening width of the base region, can be reduced to 0.3 μm. That is, not only can the area of the emitter region 11 diffused via this base region be reduced compared to the prior art but there is also a great contribution to the reduction in the base-emitter capacitance $C_{BE}$.

In particular, as the second embodiment of this invention, if the trench 8 is formed into a γ-shape as shown in FIG. 2, the exposure width of the base region which is exposed at the bottom portion of the trench 8 can be reduced to the order of 0.2 μm, therefore it is possible to further reduce the area of the emitter region 11, thus resulting in a structure which is very advantageous to an improvement in high-frequency characteristics.

Now, referring to FIG. 3 through FIG. 9, a first embodiment of a manufacturing method for an NPN-type transistor of this invention will be described in detail. In the following description, a first conducting type or a second conduction type merely means one of N and P conducting types. Accordingly, a first conducting type may be N conducting type or P conducting type, and a second conducting type is then one of the two types which is not the same as the first conducting type.

A manufacturing method for an NPN-type transistor comprises steps of, forming a first conducting type base region 3 on the surface of a second conducting type collector layer 1, forming a base electrode layer 4 on the surface of the base region 3 and forming an insulating film 5 on the surface of this base electrode layer 4, forming a trench 8, which does not reach the collector layer 1, on the base region 3 by creating an opening at a part of the base electrode layer 4 and the insulating film 5 and forming a sidewall 9 on the inside wall of the trench 8, forming a polysilicon layer 10 containing impurities for emitter diffusion inside the trench 8, forming an emitter region 11 by diffusing the impurities from the polysilicon layer 10, and forming a through hole on the insulating film 5 so as to form a base electrode 12 which comes into contact with the base electrode layer 4 and at the same time forming an emitter electrode 13 which comes into contact with the polysilicon layer 10.

Figure 3:
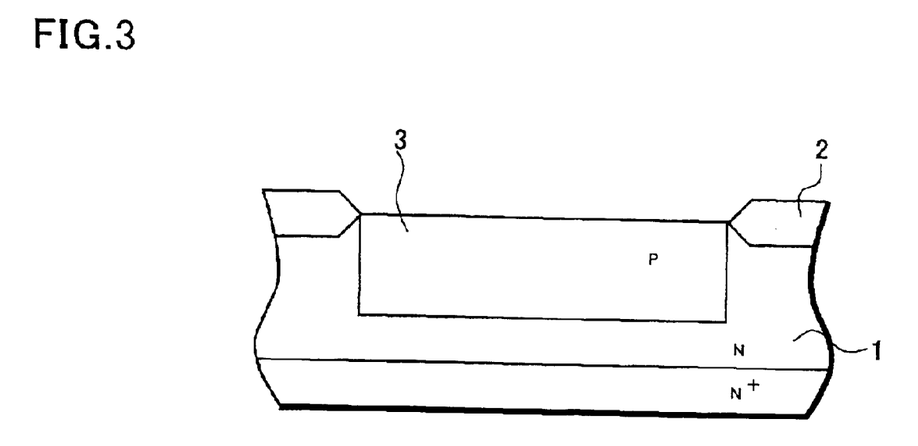
FIG. 3 is a cross-sectional view of a device intermediate according to a first manufacturing method of this invention.

The first step of the present embodiment is, as shown in FIG. 3, for forming the first conducting type base region on the surface of the second conducting type collector layer.

A collector layer 1 having a collector pick-up $N^+$-type high concentration layer is prepared. After cleaning the surface of the collector layer 1, for elements isolation, a LOCOS oxide film 2 in the order of 12000 Å is formed on the outside of a predetermined base region. After doping P-type impurities into the predetermined base region, a base region 3 having an impurity concentration in the order of $1 \times 10^{14} \text{cm}^{-2}$ is formed by thermal diffusion. In addition, a P-type epitaxial layer may be formed by vapor-phase growth so as to be the base region 3.

Figure 4:
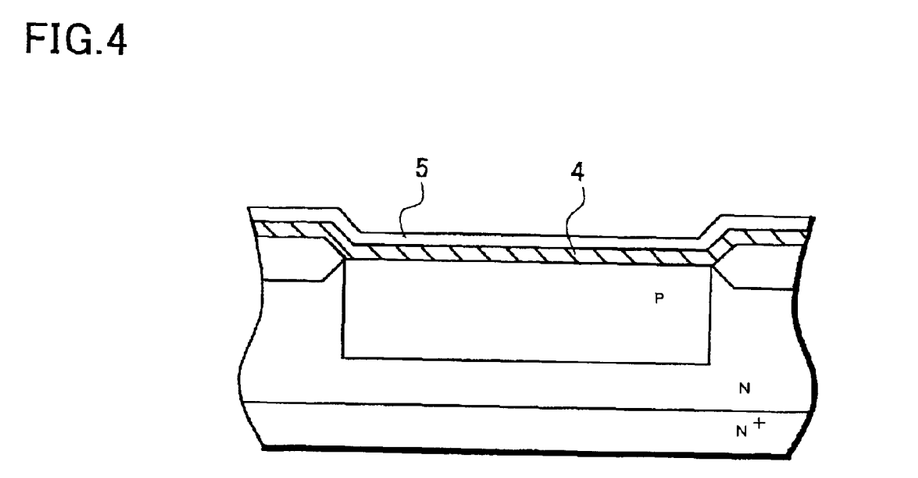
FIG. 4 is a cross-sectional view of the device intermediate according to the first manufacturing method following the step of FIG. 3, FIGS. 5A and 5B are cross-sectional views of the device intermediate according to the first manufacturing method following the step of FIG. 4.

The second step of the present embodiment is, as shown in FIG. 4, for forming a base electrode layer on the surface of the base region and forming an insulating film on the surface of this base electrode layer.

This step is a first feature of this invention. First, on the whole surface, by a CVD method, a polysilicon layer with impurities in the order of $4 \times 10^{15} \text{cm}^{-2}$ doped is deposited at a film thickness in the order of 5000 Å to form a base electrode layer 4, which comes into contact with the whole surface of the base region 3. This polysilicon layer may be a silicide layer or may have a multi-layer structure by forming a silicide layer on the polysilicon layer containing impurities.

Furthermore, an oxide film 5 having a film thickness in the order of 5000 Å is formed on this base electrode layer 4. In place of this oxide film 5, an insulating film such as a multi-layer film composed of an oxide film and a nitride film or the like may be formed.

According to this step, the base electrode layer 4 which comes into contact with the whole base region 3 is formed and the grounded area of the base electrode increases, therefore the base resistance $r_b$ can be substantially reduced compared to the prior case where grounding has been performed only via a contact hole.

In addition, since the base electrode layer 4 is provided on the whole surface of the base electrode 3, the distance from the active region of the base immediately under the emitter, which is formed in a later step, to the base electrode can be shortened, and this also greatly contributes to a reduction in the base resistance $r_b$.

Figure 5A:
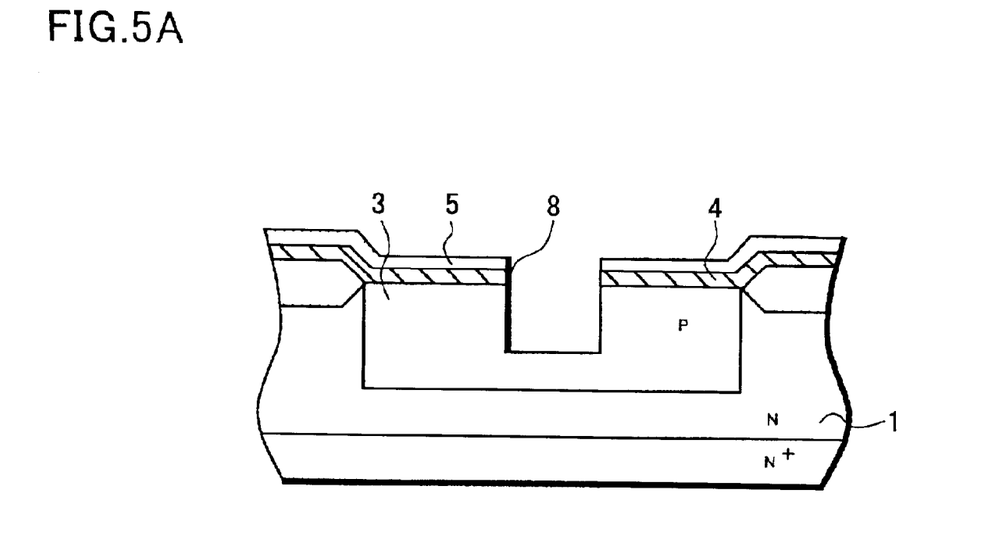
Figure 5B:
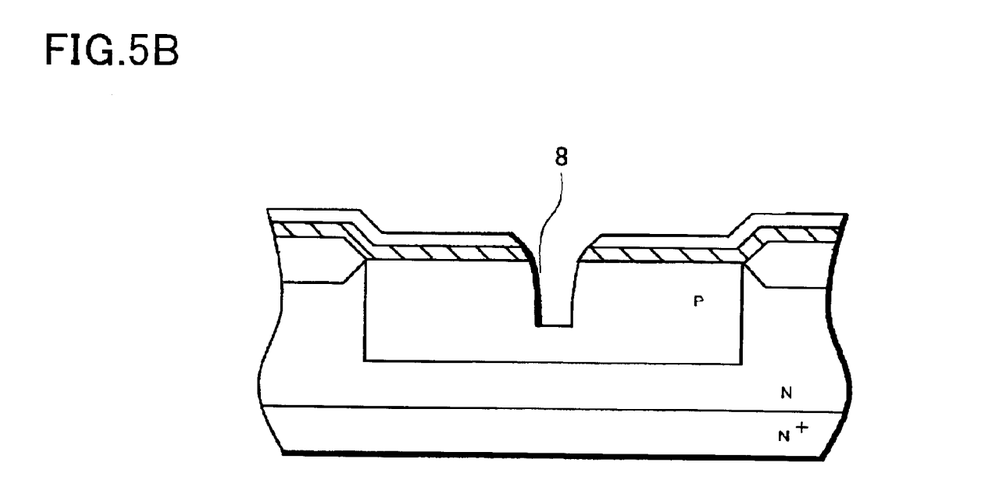
Figure 6:
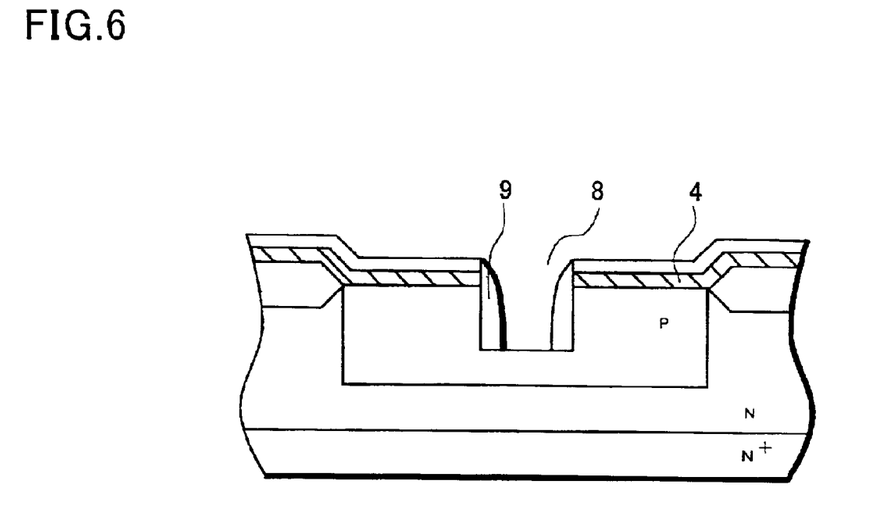
FIG. 6 is a cross-sectional view of the device intermediate according to the first manufacturing method following the step of FIG. 5A.

The third step of the present embodiment is, as shown in FIGS. 5A and 5B and FIG. 6, for forming a trench which does not reach the collector layer, on base region by creating an opening at a part of the base electrode layer and the insulating film and forming a sidewall on the inside wall of the trench.

This step is a second feature of this invention, and as a first example, a method for forming the trench 8 by anisotropic RIE (Reactive-Ion Etching) is shown in FIG. 5(A).

An opening portion having a width of 0.5 μm is provided at a predetermined position of the base electrode layer 4 and the oxide film 5 by a photo-etching technique and the base region 3 is exposed. The base region 3 is subjected to anisotropic RIE using the base electrode layer 4 and the oxide film 5 as a mask using normal etching gas and the trench 8 is formed. By the anisotropic RIE, the opening portion and bottom portion are etched with an equal width and the depth of the trench serves as a depth that determines the base width $W_b$ as mentioned above.

In FIG. 5(B), as a second example of this step, a method for forming this trench 8 into a γ-shape is shown.

Similar to the first example, an opening is provided on the base electrode 4 and the oxide film 5, and the base region 3 that is exposed from the opening portion is anisotropically etched using HBr, $N_2$, and $He/O_2$ in place of normal silicon etching gas. According to this method, etching proceeds while forming deposits on the sidewall of the etched trench owing to the characteristics of HBr and $He/O_2$. Therefore, the inside wall of the trench 8 has an slope and an angle created by a tangent line of the slope and the semiconductor substrate surface becomes gradually smaller as it proceeds from the bottom portion of the trench 8 to the semiconductor substrate surface and, consequently, the γ-shaped trench 8 whose bottom portion is narrower than the opening portion thereof is formed.

Then, as shown in FIG. 6, the sidewall 9 is formed on the inside wall of the trench 8. An NSG (non-doped silicate glass) layer is formed on the whole surface by an LP-CVD method. It is sufficient that the film thickness thereof is a half of that of the opening portion or less. Thus, the NSG film is buried inside the trench 8. Thereafter, the whole surface is anisotropically etched to remove the NSG film and the sidewall 9 is formed on the inside wall of the trench 8. Since the sidewall 9 has the same thickness as the film thickness of the deposited NSG film, if the NSG is deposited at 1000 Å, the thickness of the sidewall becomes 0.1 μm.

That is, even in the case of the first example of this step where the thickness is 0.5 μm at the opening portion, the thickness becomes 0.3 μm at the bottom portion. In particular, in the second example, since the front of the γ-shaped trench is tapered, the bottom portion of the trench 8 becomes finer due to the sidewall 9 and can be reduced, for example, to in the order of 0.2 μm.

If such a fine width of the bottom portion can be obtained, the area of the emitter region to be formed in a later step can be reduced and the base-emitter capacitance $C_{BE}$ can be reduced.

Figure 7:
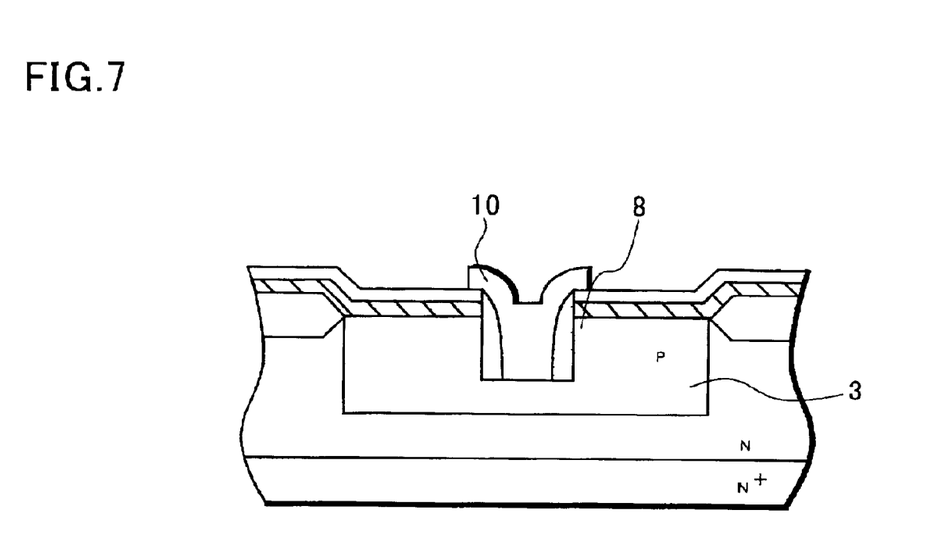
FIG. 7 is a cross-sectional view of the device intermediate according to the first manufacturing method following the step of FIG. 6.

The fourth step of the present embodiment is, as shown in FIG. 7, for forming a polysilicon layer containing impurities for emitter diffusion inside the trench.

The polysilicon layer 10 is formed on the whole surface by the CVD method. The polysilicon layer 10 fills up the inside of the trench 8 and comes into contact with the surface of the base region 3, which is exposed from the bottom portion of the trench 8. After an ion implantation of arsenic for emitter formation by diffusing the ions into the whole surface at a dose amount in the order of $1 \times 10^{15} \text{cm}^{-2}$, the polysilicon layer 10 is patterned by normal photo-etching technique so that the polysilicon layer 10 only inside the trench 8 and in the periphery thereof is left and the reminder thereof is removed.

When forming an emitter electrode in a later step, this polysilicon layer 10 constitutes a part thereof.

Figure 8:
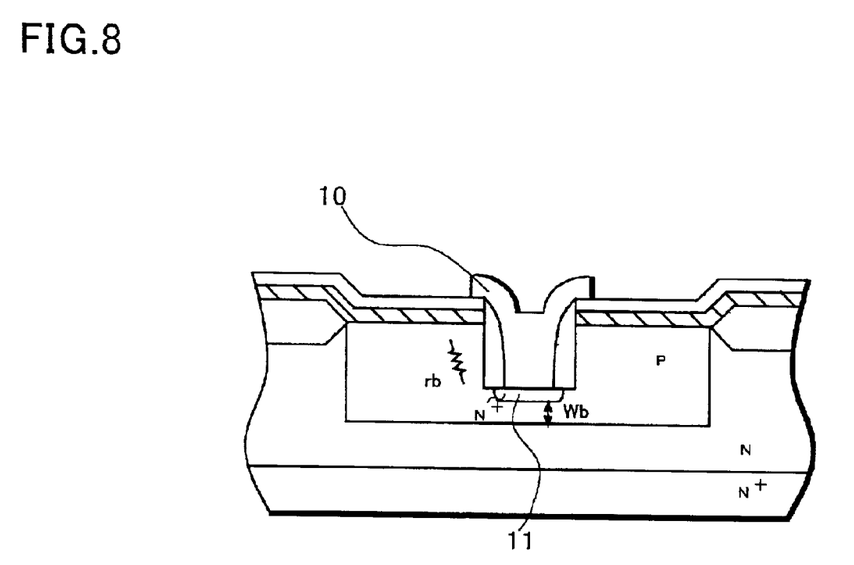
FIG. 8 is a cross-sectional view of the device intermediate according to the first manufacturing method following the step of FIG. 7.

The fifth step of the present embodiment is, as shown in FIG. 8, for forming an emitter region by diffusing impurities from the polysilicon layer.

By heating the whole device intermediate at a temperature from 900 to 1000° C. for 0.5–2 hours, arsenic is diffused from the polysilicon layer 10 and the emitter region 11 is formed. Since the inside wall of the trench 8 is coated with the sidewall 9, the impurities can be diffused only on the bottom portion of the trench 8.

In addition, the base region 3 immediately under the emitter region 11 becomes an active region of the base and the base width $W_b$ can be controlled by the depth of the trench 8. In the prior art, in order to obtain an extremely shallow junction by thermal diffusion, it is necessary to lower the impurity concentration whereby unevenness becomes great. However, in this embodiment, the base region 3 is formed with a predetermined depth, then the emitter region 11 is formed by diffusion from the bottom portion of the trench 8, whereby in spite of a shallow junction, the base region 3 can also be uniformly formed with a predetermined concentration. Thus, the step becomes simple, and the unevenness of the active base region can be reduced.

In particular, as mentioned above, since the bottom portion is narrower in the case of the γ-shaped trench 8, a finer emitter region 11 can be obtained and there is a great contribution to a reduction in the base-emitter capacitance, thus high-frequency characteristics are improved.

Figure 9:
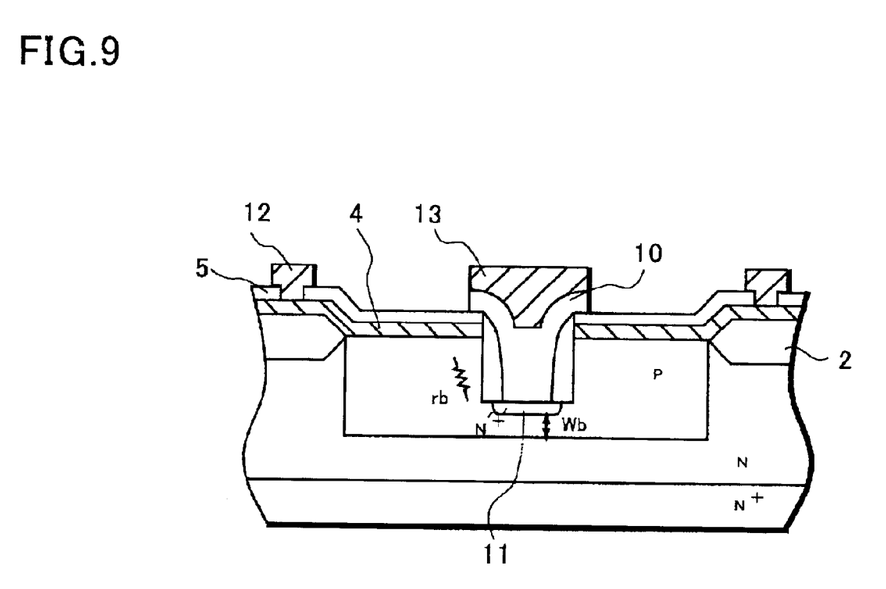
FIG. 9 is a cross-sectional view of the device according to the first manufacturing method following the step of FIG. 8.

The sixth step of the present embodiment is, as shown in FIG. 9, forming a through hole on the insulating film, forming a base electrode which comes into contact with the base electrode layer, and at the same time forming an emitter electrode which comes into contact with the polysilicon layer.

By creating an opening on the oxide film 5 by the photo-etching technique, a through hole which exposes a part of the base electrode layer 4 on the LOCOS oxide film 2 is formed. A conductive material is deposited on the whole surface and photo-etched into a predetermined shape, whereby the base electrode 12 which comes into contact with the base electrode layer 4 is formed.

Since the base electrode layer 4 with which the base electrode 12 comes into contact is formed adjacently to the opening portion of the trench 8, carriers move between the active region of the base immediately under the emitter region 11 and the base electrode layer 4 extending to the opening portion. The distance can be substantially reduced compared to the prior art where the base electrode is provided only at the contact hole, and thus the grounded area is also increased. Furthermore, there is a great contribution to a reduction in the base resistance $r_b$.

In addition, since the LOCOS oxide film 2 for isolation is formed on the collector layer 1, the base-collector capacitance at this portion can also be reduced.

On the other hand, by this photo-etching, the emitter electrode 13 is simultaneously formed on the polysilicon layer 10. A collector electrode (not shown in the figure) is formed by vapor-depositing metal on the back face.

Now, referring to FIG. 10 through FIG. 16, a second embodiment of a manufacturing method for the NPN-type transistor of this invention will be described in detail. In the following description, a first conducting type or a second conduction type merely means one of N and P conducting types. Accordingly, a first conducting type may be N conducting type or P conducting type, and a second conducting type is then one of the two types which is not the same as the first conducting type.

The second embodiment of a manufacturing method for the NPN-type transistor comprises steps of, preparing a first conducting type collector layer 1, forming a base electrode layer 4 made of polysilicon containing second conducting type impurities on the surface of the collector layer 1 and forming an insulating film 5 on the surface of this base electrode layer 4, forming a trench 8 on the collector layer 1 by creating an opening at a part of the base electrode layer 4 and the insulating film 5 and doping second conducting type impurities into the whole surface, forming a sidewall 9 on the inside wall of the trench 8, forming a polysilicon layer 10 containing impurities for emitter diffusion inside the trench 8, diffusing the impurities in the base electrode layer 4 and in the periphery of the trench 8 and forming a base region 3 and, at the same time, diffusing the impurities from the polysilicon layer 10 and forming an emitter region 11, forming a through hole on the insulating film 5 and forming a base electrode 12 which comes into contact with the base electrode layer 4 and, at the same time, forming an emitter electrode 13 which comes into contact with the polysilicon layer 10.

Figure 10:
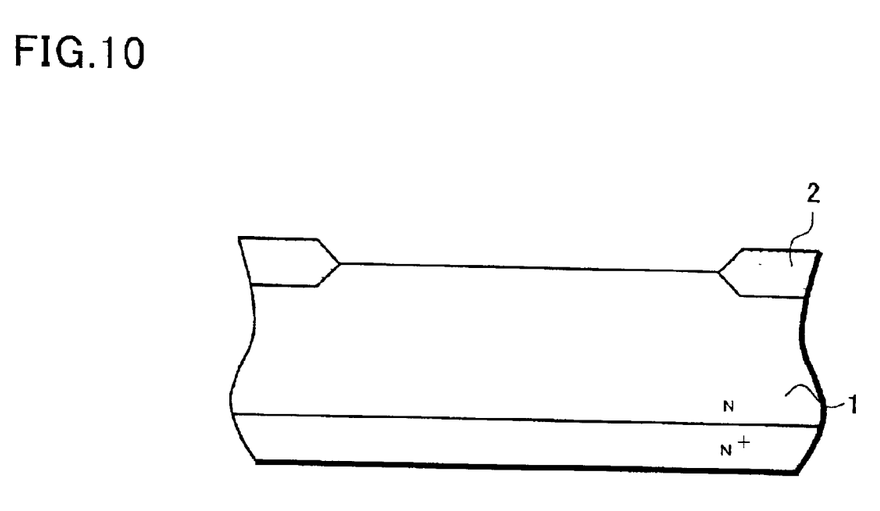
FIG. 10 is a cross-sectional view of a device intermediate according to a second manufacturing method of this invention.

The first step of the present embodiment is, as shown in FIG. 10, for preparing the first conducting type collector layer.

A collector layer 1 having a collector pick-up $N^+$-type high concentration layer is prepared. After purifying the surface of the collector layer 1, for elements isolation, a LOCOS oxide film 2 in the order of 12000 Å is formed on the outside of a predetermined base region.

Figure 11:
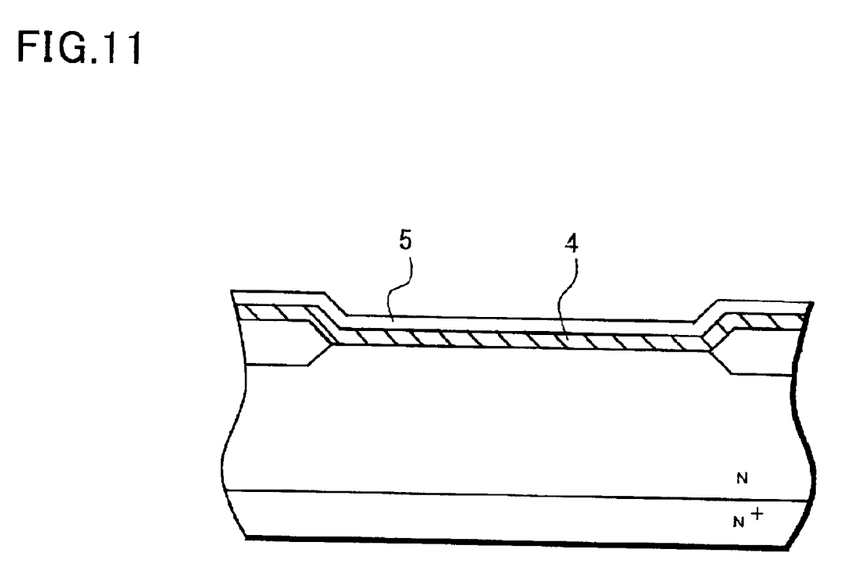
FIG. 11 is a cross-sectional view of the device intermediate according to the second manufacturing method following the step of FIG. 10, FIGS. 12A and 12B are cross-sectional views of the device intermediate according to the second manufacturing method following the step of FIG. 11.

The second step of the present embodiment is, as shown in FIG. 11, for forming a base electrode layer made of polysilicon containing the second conducting type impurities on the surface of the collector layer and forming an insulating film on the surface of the base electrode layer.

Similar to the first embodiment, this step is a first feature of this invention. On the whole surface, by the CVD method, a polysilicon layer with P-type impurities (dopants) in the order of $4 \times 10^{15} cm^{-2}$ is deposited at a film thickness in the order of 5000 Å and a base electrode layer 4, which comes into contact with the collector layer 1 and the LOCOS oxide film 2, is formed.

Furthermore, an oxide film 5 having a film thickness in the order of 5000 Å is formed on this base electrode layer 4. In place of this oxide film 5, an insulating film such as a multi-layer film composed of an oxide film and a nitride film or the like may be formed.

Figure 12A:
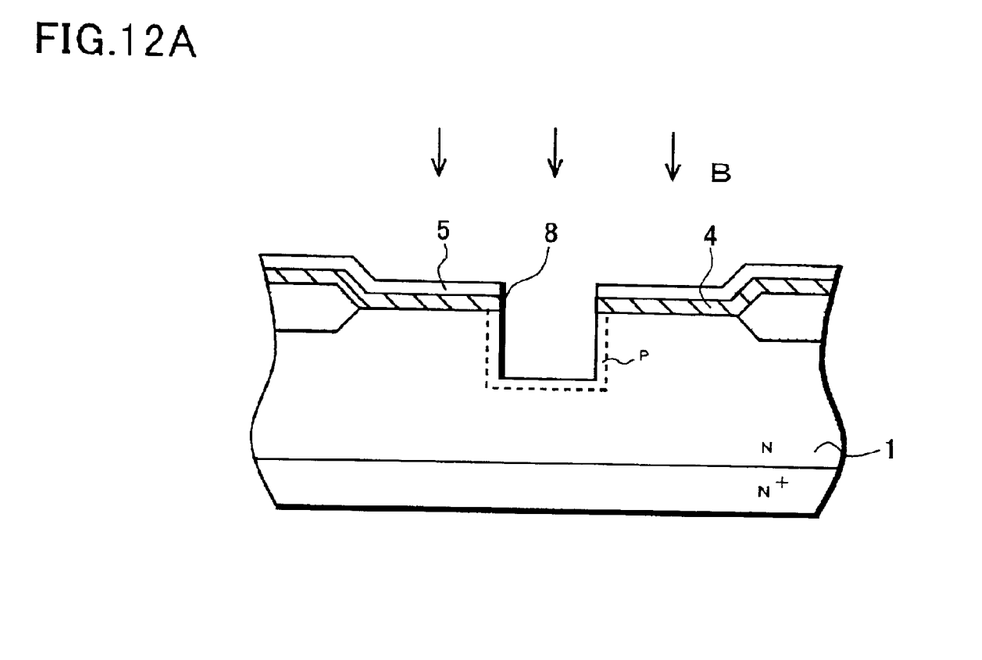
Figure 12B:
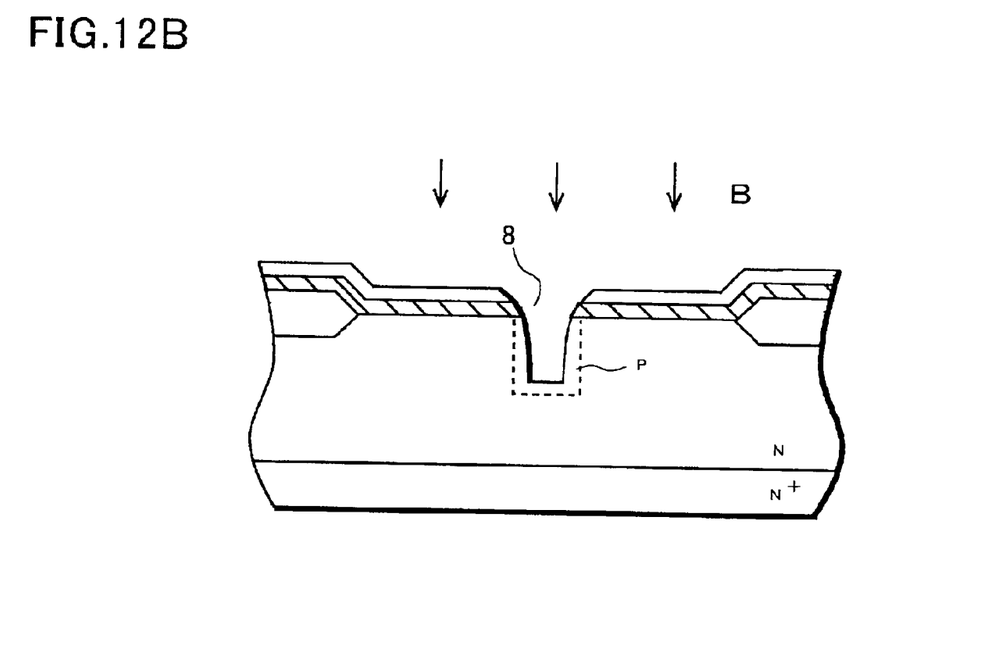

The third step of the present embodiment is, as shown in FIGS. 12A and 12B, for forming a trench on the collector layer by creating an opening at a part of the base electrode layer and the insulating film and doping second conducting type impurities into the whole surface.

Similar to the first embodiment, this step also is a second feature of this invention, and a method for forming the trench 8 by anisotropic RIE is shown in FIG. 12(A).

An opening portion having a width of 0.5 μm is provided at a predetermined position of the base electrode layer 4 and the oxide film 5 by the photo-etching technique and the collector layer 1 is exposed. The collector layer 1 is subjected to anisotropic RIE using the base electrode layer 4 and the oxide film 5 as a mask using normal etching gas and the trench 8 is formed. By the anisotropic RIE, the opening portion and bottom portion are etched with an equal width.

In addition, similar to the first embodiment, by carrying out anisotropic etching using HBr, $N_2$, and He/$O_2$ as silicon etching gas, the trench 8 may be formed into a γ-shape as shown in FIG. 12(B).

Thereafter, P-type impurities such as boron in the order of $1 \times 10^{14} cm^{-2}$ are ion-doped into the whole surface of the device intermediate. Thereby, the P-type impurities are doped into the base electrode layer 4 and into the portion of the collector layer 1 surrounding the trench 8, as indicated by the dotted lines in FIGS. 12A and 12B.

Figure 13:
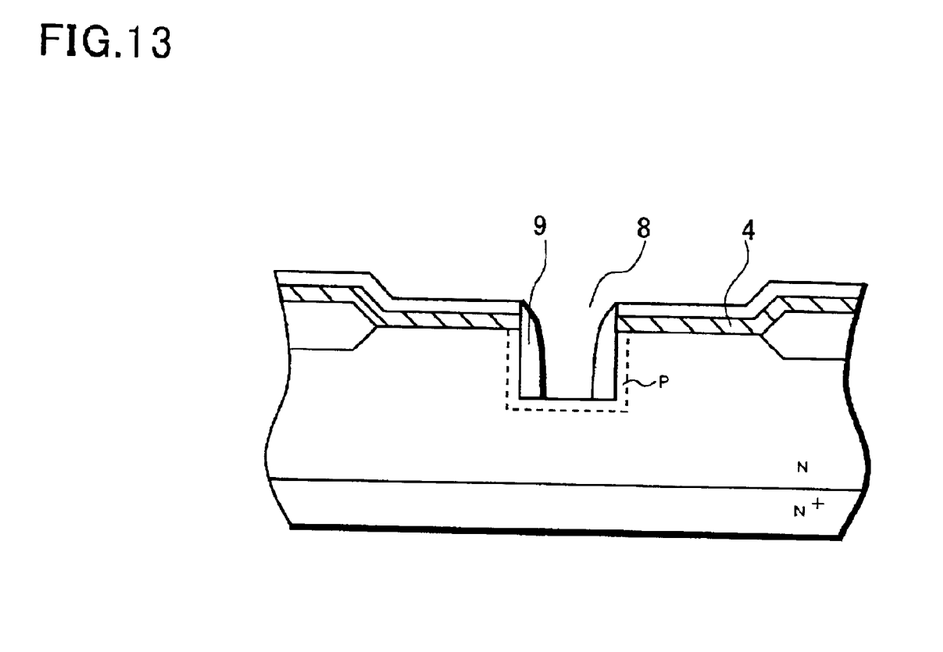
FIG. 13 is a cross-sectional view of the device intermediate according to the second manufacturing method following the step of FIG. 12A.

The fourth step of the present embodiment is, as shown in FIG. 13, for forming a sidewall on the inside wall of the trench.

This step is identical to the description of FIG. 6 showing the third step of the first embodiment, therefore description thereof is omitted here.

Figure 14:
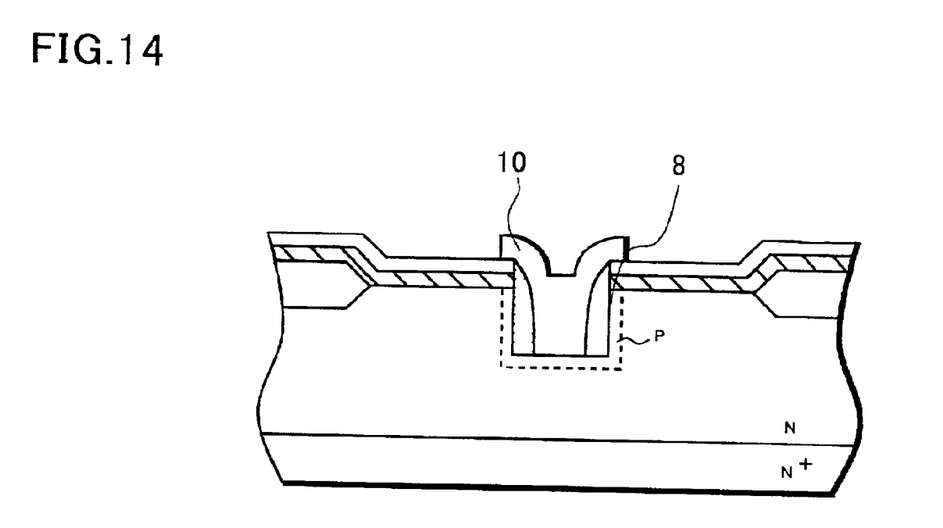
FIG. 14 is a cross-sectional view of the device intermediate according to the second manufacturing method following the step of FIG. 13.

The fifth step of the present embodiment is, as shown in FIG. 14, for forming a polysilicon layer which includes impurities for emitter diffusion inside the trench.

This step is also identical to the description of FIG. 7 showing the fourth step of the first embodiment, therefore description thereof is omitted here.

Figure 15:
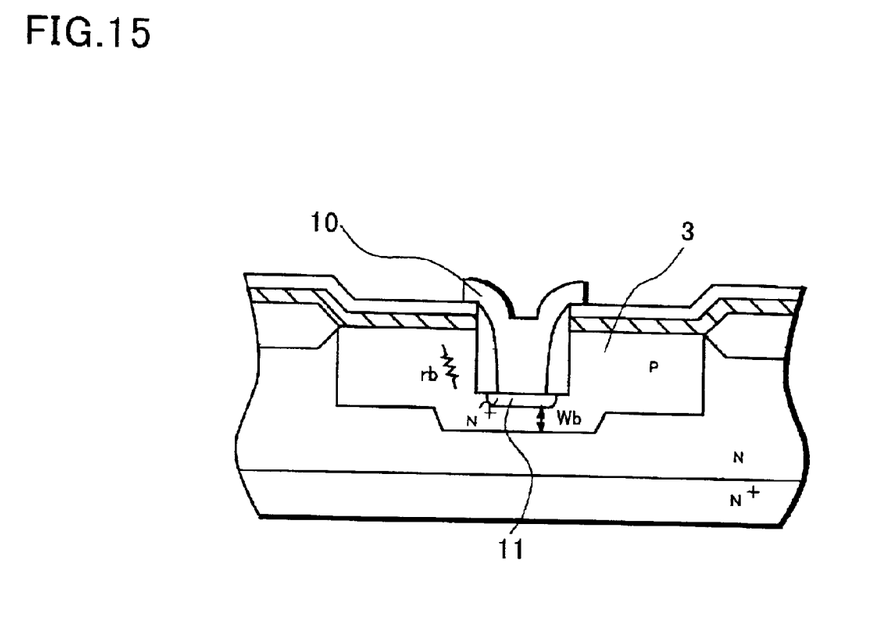
FIG. 15 is a cross-sectional view of the device intermediate according to the second manufacturing method following the step of FIG. 14.

The sixth step of the present embodiment is, as shown in FIG. 15, for forming a base region by diffusing impurities in the trench formed on the base electrode and the collector layer and in the periphery of the trench, and at the same time forming an emitter region by diffusing impurities from the polysilicon layer.

This step also is a third feature of this invention. By heating the whole device intermediate at a temperature from 900 to 1000° C. for 0.5–2 hours, P-type impurities that have been doped in the base electrode layer 4, the trench 8, and the periphery of the trench 8 are diffused into the collector layer 1, whereby forming the base region 3. At the same time, by diffusing arsenic from the polysilicon layer 10, the emitter region 11 is formed. Since the inside wall of the trench 8 is coated with the sidewall, the emitter impurities can be diffused only on the bottom portion of the trench 8.

Thus, the base region 3 immediately under the emitter region 11 which becomes an active region of the base can be formed by ion implantation from the bottom portion of the trench 8 and thermal diffusion, therefore in spite of a shallow junction, the impurity concentration becomes uniform and the unevenness in the base active region can be suppressed.

Also, the impurity concentration becomes uniform in the base region 3 as a whole and unevenness can be suppressed.

Figure 16:
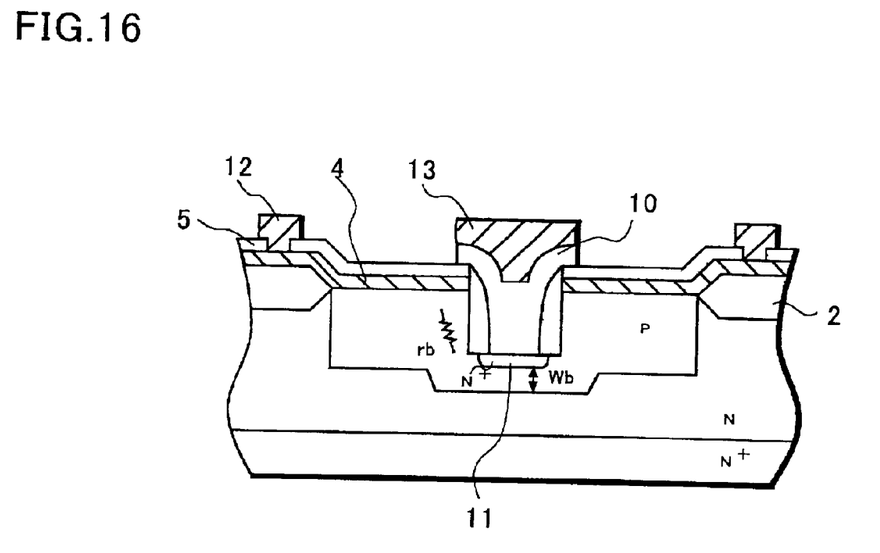
FIG. 16 is a cross-sectional view of the device according to the second manufacturing method following the step of FIG. 15.

The seventh step of the present embodiment is, as shown in FIG. 16, for forming a through hole on the insulating film and forming a base electrode which makes contact with the base electrode layer and, at the same time, forming an emitter electrode which makes contact with the polysilicon layer.

This step is identical to the description of FIG. 9 showing the sixth step of the first embodiment, therefore description thereof is omitted here.

Moreover, in the present embodiment, a description has been given of the NPN-type transistor as an example, however, a PNP-type transistor wherein the conductivity is reversed can also be carried out.

The above is a detailed description of particular embodiments of the invention. It is recognized that departures from the disclosed embodiment may be made within the scope of the invention and that obvious modifications will occur to a person skilled in the art. The full scope of the invention is set out in the claims that follow and their equivalents. Accordingly, the claims and specification should not be construed to narrow the full scope of protection to which the invention is entitled.

What is claimed is:

1. A method for manufacturing a semiconductor device comprising:

doping impurities of a first conducting type into a surface of a collector layer of a second conducting type and thermally diffusing the impurities of the first conducting type to form a base region of the first conducting type in the surface of the collector layer;

forming a base electrode layer on a surface of the base region and forming an insulating film on a surface of the base electrode layer;

forming a trench, which does not reach the collector layer, by etching the base region through an opening created at part of the base electrode layer and the insulating film and forming a sidewall on an inside wall of the trench;

forming a polysilicon layer containing impurities for emitter diffusion inside the trench;

forming an emitter region by diffusing the impurities of the polysilicon layer; and forming a through hole in the insulating film, forming a base electrode contacting the base electrode layer through the through hole and forming an emitter electrode contacting the polysilicon layer.

2. The method for manufacturing a semiconductor device of claim 1, wherein the trench is formed as a γ-shaped trench.

3. The method for manufacturing a semiconductor device according to claim 1, wherein the base electrode layer is made of polysilicon, silicide, or a multilayer film comprising polysilicon and silicide.

4. The method for manufacturing a semiconductor device according to claim 2, wherein the base electrode layer is made of polysilicon, silicide, or a multi-layer film comprising polysilicon and silicide.

5. A method for manufacturing a semiconductor device comprising:

preparing a collector layer of a first conducting type;

forming a base electrode layer made of polysilicon containing impurities of a second conducting type on a surface of the collector layer and forming an insulating film on a surface of the base electrode layer;

forming a trench by etching the collector layer through an opening created at part of the base electrode layer and the insulating film and doping impurities of the second conducting type into the trench and the base electrode layer;

forming a sidewall on an inside wall of the trench;

forming a polysilicon layer containing impurities for emitter diffusion inside the trench;

diffusing the impurities of the second conducting type for forming a base region and, at the same time, diffusing the impurities of the polysilicon layer for forming an emitter region; and forming a through hole in the insulating film, forming a base electrode contacting the base electrode layer through the through hole and forming an emitter electrode contacting the polysilicon layer.

6. The method for manufacturing a semiconductor device of claim 5, wherein the trench is formed as a γ-shaped trench.

7. The method for manufacturing a semiconductor device of claim 1, wherein the base electrode and the emitter electrode are formed in a same processing step.

8. The method for manufacturing a semiconductor device of claim 1, wherein the emitter region is formed by diffusing the impurities of the polysilicon layer so that the emitter region is formed within the base region.

9. The method for manufacturing a semiconductor device of claim 5, wherein the base electrode and the emitter electrode are formed in a same processing step.

* * * * *